(12) United States Patent
Chang et al.

(10) Patent No.: US 12,256,539 B2
(45) Date of Patent: Mar. 18, 2025

(54) ONE-TIME-PROGRAMMABLE MEMORY DEVICES HAVING FIRST TRANSISTOR, SECOND TRANSISTOR, AND RESISTOR IN SERIES

(71) Applicant: Taiwan Semiconductor Manufacturing Company Ltd., Hsinchu (TW)

(72) Inventors: Meng-Sheng Chang, Chu-bei (TW); Yao-Jen Yang, Hsinchu County (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 419 days.

(21) Appl. No.: 17/721,658

(22) Filed: Apr. 15, 2022

(65) Prior Publication Data

US 2023/0337419 A1    Oct. 19, 2023

(51) Int. Cl.
*H10B 20/25*        (2023.01)
*H01L 23/525*       (2006.01)

(52) U.S. Cl.
CPC ......... *H10B 20/25* (2023.02); *H01L 23/5256* (2013.01)

(58) Field of Classification Search
CPC .................. H10B 20/20; H01L 23/5256
See application file for complete search history.

(56) References Cited

U.S. PATENT DOCUMENTS

| 11,114,176 B1* | 9/2021 | Lee .................. G11C 17/16 |
| 2005/0181546 A1* | 8/2005 | Madurawe .......... H01L 27/0688 |
| | | 438/132 |
| 2011/0156157 A1* | 6/2011 | Milani ............... H01L 27/0922 |
| | | 257/E21.632 |
| 2016/0307962 A1* | 10/2016 | Yi .................. G11C 11/1675 |
| 2017/0200727 A1* | 7/2017 | Yoon ..................... H10B 20/20 |
| 2021/0035636 A1* | 2/2021 | Nazarian ............ G11C 13/0069 |

* cited by examiner

*Primary Examiner* — Michael Jung
(74) *Attorney, Agent, or Firm* — FOLEY & LARDNER LLP

(57) ABSTRACT

A memory device includes a plurality of memory cells, each of which includes a first transistor, a second transistor, and a resistor operatively coupled to each other in series. Each of the first and second transistors include a sub-transistor, the sub-transistor having a channel structure, a source structure disposed on one side of the channel structure, and a drain structure disposed on the other side of the channel structure. The resistor includes a metal structure disposed above the first and second transistors. The channel structures, source structures, and drain structures of the sub-transistors are all formed in a first active region of a substrate.

18 Claims, 12 Drawing Sheets

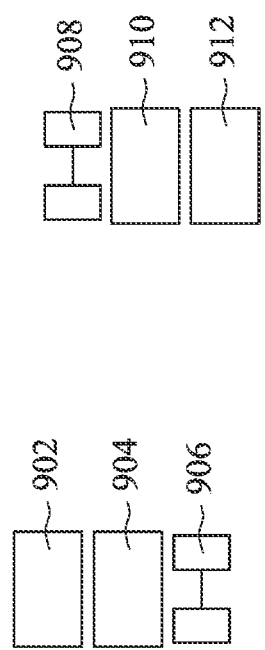
Fig. 9D
Fig. 9C
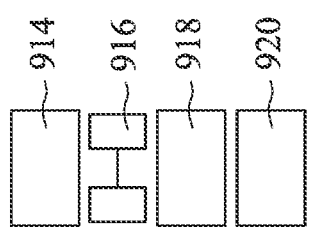
Fig. 9B
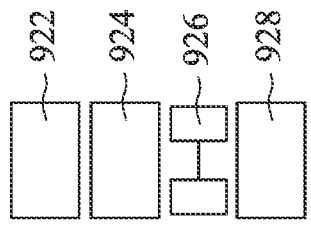
Fig. 9A

1

ONE-TIME-PROGRAMMABLE MEMORY DEVICES HAVING FIRST TRANSISTOR, SECOND TRANSISTOR, AND RESISTOR IN SERIES

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A, 9B, 9C, and 9D illustrate various block diagrams of different portions of one memory cell of the memory device of FIG. 1, in accordance with some embodiment.

DETAILED DESCRIPTION

Figure 1:
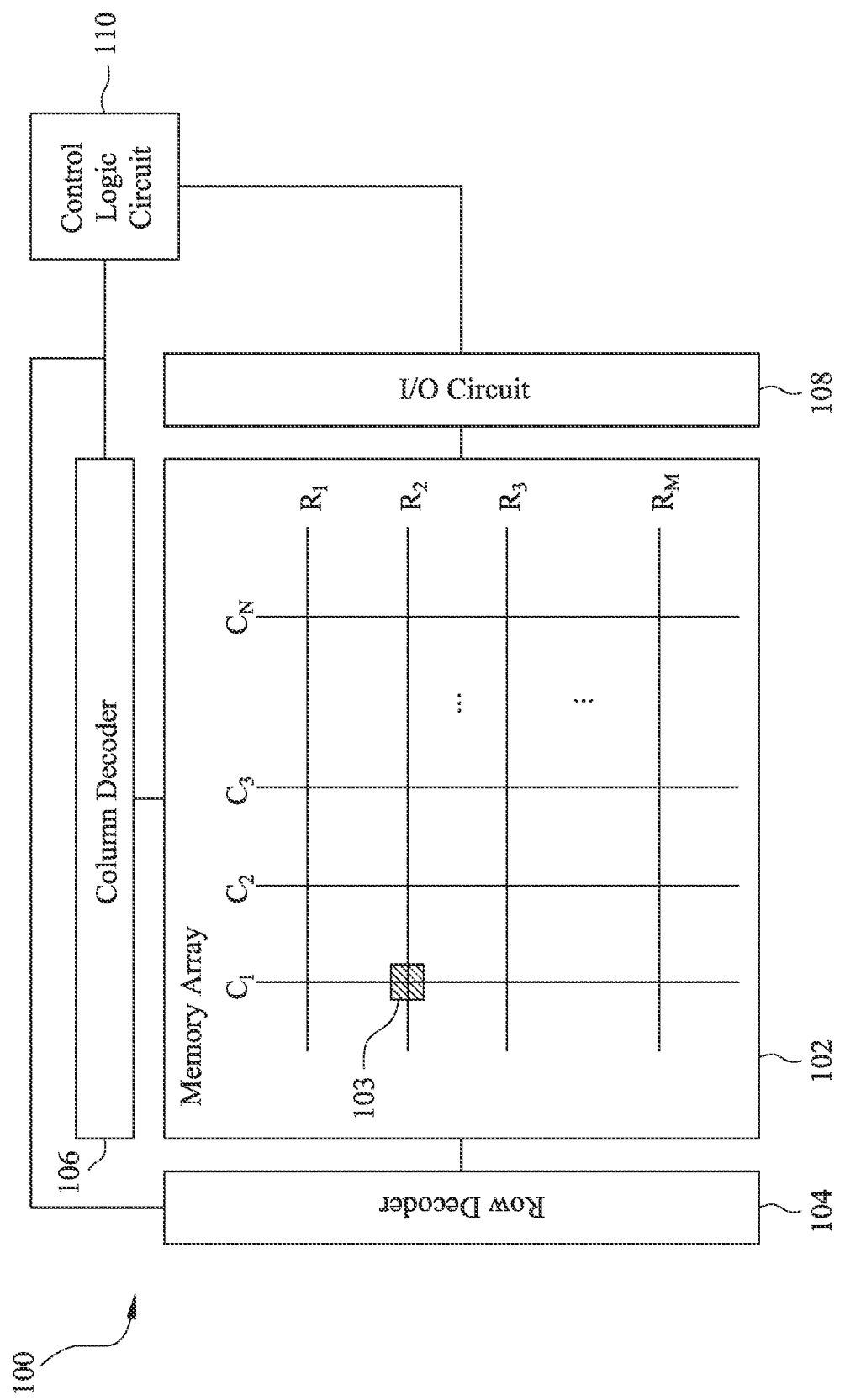
FIG. 1 illustrates a block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device is one type of the non-volatile memory device utilized in integrated circuits for adjusting the circuitry after fabrication of an integrated circuit. For example, the OTP memory device is used for providing repair information that controls the usage of redundant cells in replacing defective cells of a memory array. Another use is for tuning analog circuitry by trimming a capacitive or resistive value of an analog circuit or enabling and disabling portions of the system. A recent trend is that the same product is likely to be manufactured in different fabrication facilities though in a common process technology. Despite best engineering efforts, it is likely that each facility will have a slightly different process. Usage of OTP memory devices allows independent optimization of the product functionality for each manufacturing facility.

As integrated circuit technology advances, integrated circuit features (e.g., transistor gate length) have been decreasing, thereby allowing for more circuitry to be implemented in an integrated circuit. One challenge with implementing OTP memory devices such as, for example, a fuse, an electronic fuse (efuse), etc., in an integrated circuit is that efuse size reduction has not advanced at nearly the same rate as the reduction in size of transistor features. Accordingly, efuses may require a greater relative portion of the integrated circuit as integrated circuit technology advances.

In the existing configurations of efuse devices, each efuse cell is typically constituted by a resistor and a transistor. The resistor and transistor are operatively (e.g., electrically) coupled in series. Such a configuration is typically referred to as a "one-transistor-one-resistor (1T1R)" configuration. In OTP applications, the resistor may irreversibly transition from a first resistance state to second resistance state, which correspond to a first logic state and second logic state of the efuse cell, respectively. In general, such efuse cells may be arranged as an array, for example, the efuse cells arranged in a number of columns and a number of rows. To uniquely access (e.g., read) one of the cells, a first access line (e.g., a bit line (BL)), coupled to a group of cells including the to-be accessed cell, is asserted, and a second access line (e.g., a word line (WL)) gating a transistor of the to-be accessed cell is asserted. Accordingly, the to-be accessed cell is selected.

A logic state of the selected cell can be read based on a current level flowing through the selected cell.

However, such 1T1R configurations may encounter various issues when the technology nodes continue to shrink. Although only the transistor of the selected cell is asserted (e.g., turned on), one or more of the transistors of unselected cells that are also coupled to the same BL may have leakage, even being turned off. Such leakage current can accumulate. When a level of the leakage current exceeds a certain threshold, the efuse device can malfunction. For example, the logic state of a selected cell, which is supposedly to be read as logic 1 (when its resistance state is in a high state thereby conducting a low current level), will be misread as logic 0 because of the contribution of leakage current flowing through the unselected cells. Alternatively stated, the leakage current can alter a relatively low current level (corresponding to a first logic state) to a relatively high current level (corresponding to a second, different logic state). Furthermore, in 1T1R configurations, the program voltage stresses the device. Such stress by the high program voltage can short the circuit, thereby reducing the reliability of the device. Thus, the current efuse devices have not been entirely satisfactory in every aspect.

The present disclosures provides various embodiments of a memory device that includes a number of efuse cells. Each of the efuse cells includes a resistor made of a metal structure, a first transistor, and a second transistor coupled in series. The first transistor is coupled between a common node connecting the first and second transistors and ground. The second transistor is coupled between the common node and one end of the resistor, with the other end coupled to the resistor. Such a configuration may sometimes be referred to as a "two-transistors-one-resistor (2T1R)" configuration. With this 2T1R configuration, each of the first and second transistors can be implemented as a smaller device operating under a relatively low voltage. By including the second transistor for each cell, the voltage level present on the common node can be pulled up higher than a voltage level present on a gate terminal of the first transistor. With such a voltage difference across the first transistor for each of the unselected cells, leakage current flowing through the unselected cells can be significantly limited. Furthermore, the first and second transistors of the disclosed efuse cell are formed within the same active region of a substrate, in accordance with various embodiments. As such, no additional interconnect structures are needed to connect the first and second transistors, which can significantly reduce a voltage drop undesirably induced along the interconnect structures. Therefore, the disclosed efuse cells can present a better program efficiency.

FIG. 1 illustrates a memory device 100, in accordance with various embodiments. In the illustrated embodiment of FIG. 1, the memory device 100 includes a memory array 102, a row decoder 104, a column decoder 106, an input/output (I/O) circuit 108, and a control logic circuit 110. Despite not being shown in FIG. 1, the components of the memory device 100 may be operatively coupled to each other and to the control logic circuit 110. Although, in the illustrated embodiment of FIG. 1, each component is shown as a separate block for the purpose of clear illustration, in some other embodiments, some or all of the components shown in FIG. 1 may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., X direction) and a number of columns $C_1, C_2, C_3 \ldots C_N$, each extending in a second direction (e.g., Y direction). Each of the rows/columns may include one or more conductive structures. In some embodiments, each memory cell 103 is arranged in the intersection of a corresponding row and a corresponding column and can be operated according to voltages or currents through the respective conductive structures of the column and row.

In various embodiments of the present disclosure, each memory cell 103 is implemented as an efuse cell that includes a fuse resistor, a first transistor, and a second transistor coupled in series, where the fuse resistor includes a metal resistor configured to be burn down after being successfully programmed. The first and second transistors can have respective different threshold voltages. Specifically, the first transistor serially coupled between the efuse resistor and the second transistor has a lower threshold voltage than the second transistor. It should be understood that the memory cell 103 can include a resistive random-access memory (RRAM) cell, a ferroelectric random access memory (FeRAM) cell, a phase-change random access memory (PCRAM) cell, a magnetic tunnel junction random access memory (MTJ RAM) cell, a spin transfer torque magnetic random access memory (STT-MRAM) cell, etc., while remaining within the scope of present disclosure.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108).

Figure 2:
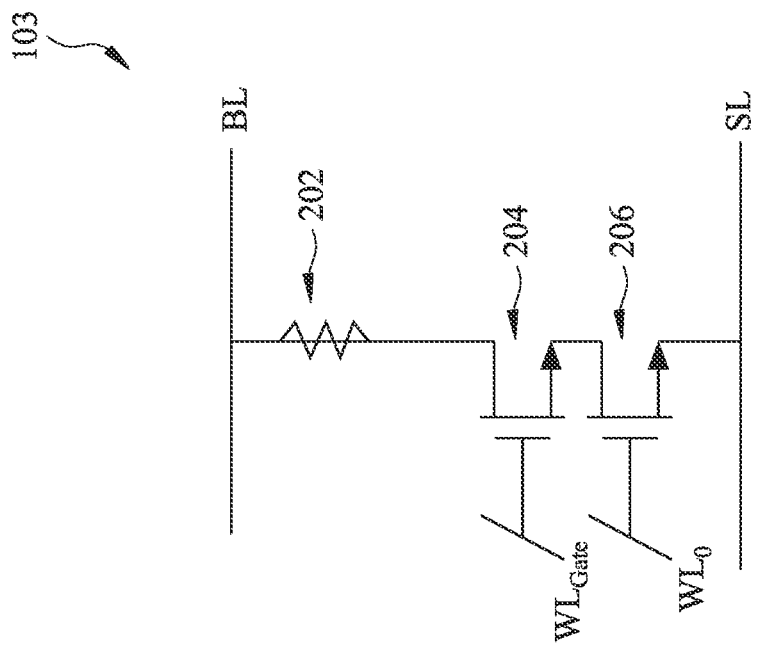
FIG. 2 illustrates an example circuit diagram of a memory cell of the memory device of FIG. 1, in accordance with some embodiments.

FIG. 2 illustrates an example configuration of the efuse cell 103 (FIG. 1), in accordance with some embodiments. The efuse cell 103 is implemented as a 2T1R configuration, for example, a resistor 202 (sometimes referred to as a "fuse resistor") is serially connected to a first transistor 204 and then a second transistor 206. It should be understood that any of various other cell configurations that exhibit the characteristic of variable resistance and multi-threshold voltages may be used by the efuse cell 103 such as, for example, a 2-diodes-1 resistor (2D1R) configuration, a many-transistors-one-resistor (manyT1R) configuration such as 3T1R configuration, etc., while remaining within the scope of the present disclosure.

With the fuse resistor 202 (of the efuse cell 103) embodied as a metal structure, the fuse resistor 202 may present an initial resistance value (or resistivity), for example, as fabricated. To program the efuse cell 103, the first transistor 204 (if embodied as an n-type transistor) is turned on by applying a signal (e.g., voltage), corresponding to a logic high state, through a word line (WL), $WL_{Gate}$, to a gate terminal of the first transistor 204. The second transistor 206 is turned on by applying a signal (e.g., voltage) through $WL_0$. Concurrently or subsequently, a high enough signal (e.g., voltage) is applied on one of the terminals of the fuse resistor 202 through a bit line (BL). With the first and second transistors 204, 206 turned on to provide a (e.g., program) path from the BL, through the resistor 202 and transistors 204 and 206, and to a source line (SL) connected to ground, such a high voltage signal can burn out a portion of the corresponding metal structure (the fuse resistor 202), thereby transitioning the fuse resistor 202 from a first state (e.g., a short circuit) to a second state (e.g., an open circuit). Accordingly, the efuse cell 103 can irreversibly transition from a first logic state (e.g., logic 0) to a second logic state (e.g., logic 1), which can be read out by applying a relatively low voltage signal on the BL and turning on the first transistor 204 to provide a (e.g., read) path.

In accordance with various embodiments of the present disclosure, the first transistor 204 and second transistor 206 each may be an n-type transistor or a p-type transistor, and, the fuse resistor 202 is formed of one or more metal structures. For example, the fuse resistor 202 may be one of a number of interconnect structures in one of a number metallization layers that are disposed above the first and second transistors, 204 and 206. Specifically, the first transistor and second transistor, 204 and 206, are formed over a major surface of a semiconductor substrate, which is sometimes referred to as part of front-end-of-line (FEOL) processing. Over the FEOL processing, the metallization layers, each of which includes a number of interconnect (e.g., metal) structures, are typically formed. These metallization layers are sometimes referred to as part of back-end-of-line (BEOL) processing.

Figure 3:
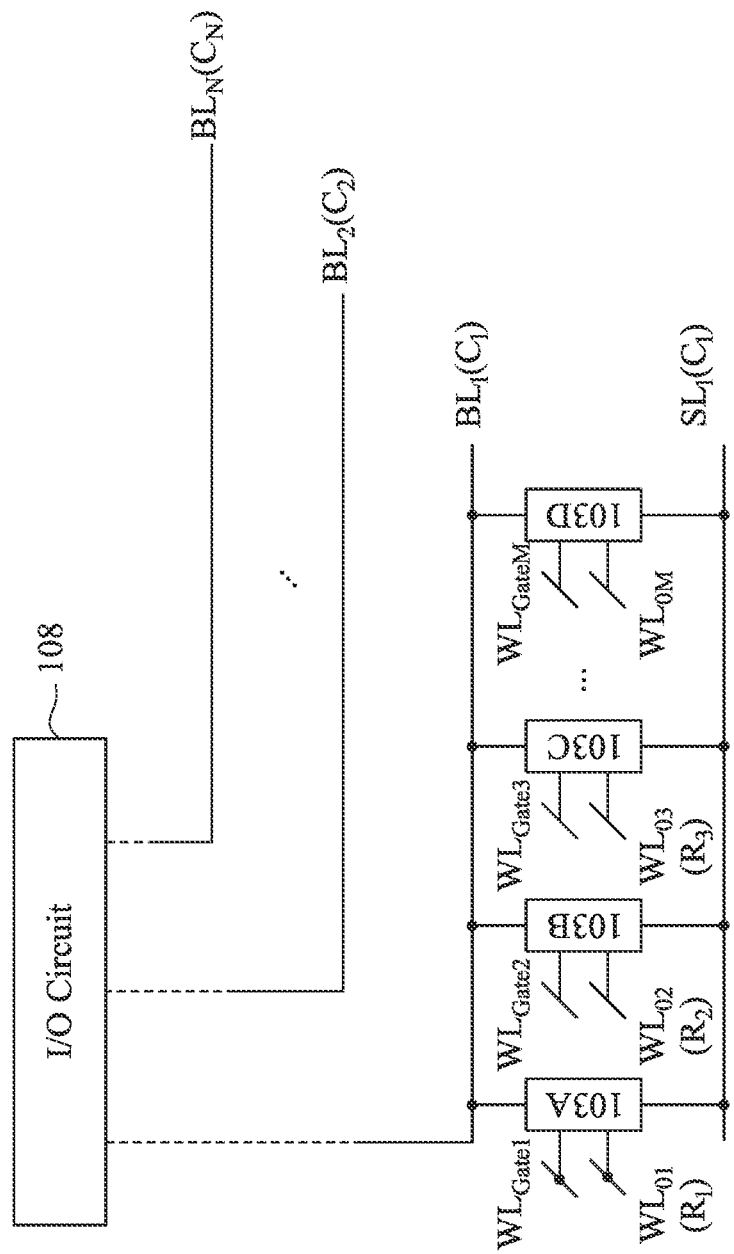
FIG. 3 illustrates an example circuit diagram of a memory array of the memory device of FIG. 1, in accordance with some embodiments.

FIG. 3 illustrates an example circuit diagram of a portion of the memory device 100 (FIG. 1), in accordance with various embodiments. In the illustrated example of FIG. 3, four efuse cells, 103A, 103B, 103C, and 103D, of the memory array 102 are shown. According to various embodiments, each of the cells 103A-D is substantially similar to the efuse cell 103 discussed with respect to FIG. 2. Although four efuse cells are shown, it should be appreciated that the memory array 102 can have any number of efuse cells, while remaining within the scope of present disclosure.

As mentioned above with respect to FIG. 1, the efuse cells 103 of the memory array 102 are formed as an array, in which the efuse cells are arranged over a number of columns and a number of rows. For example, a subset of the efuse cells is arranged along one of the rows, and each of the subset of efuse cells is arranged along a respective column. Alternatively stated, each of the efuse cells is arranged at the intersection of a column and a row. As shown in the example of FIG. 3, the efuse cell 103A is arranged at the intersection of column $C_1$ and row $R_1$; the efuse cell 103B is arranged at the intersection of column $C_1$ and row $R_2$; the efuse cell 103C is arranged at the intersection of column $C_1$ and row $R_3$; and the efuse cell 103D is arranged at the intersection of column $C_1$ and row $R_M$. The column $C_1$ includes a first bit line $BL_1$ and a first source line $SL_1$, while the other columns ($C_2 \ldots C_N$) each include its respective BL ($BL_2$, $BL_N$) and SL (not shown). The row $R_1$ includes a pair of word lines $WL_{O1}$ and $WL_{Gate1}$; the row $R_2$ includes a pair of word lines $WL_{O2}$ and $WL_{Gate2}$; the row $R_3$ includes a pair of word lines $WL_{O3}$ and $WL_{Gate3}$; and the row $R_M$ includes a pair of word lines $WL_{OM}$ and $WL_{GateM}$.

It should be noted that the bit lines and source lines are not necessarily disposed in the column of a memory array, neither are the word lines disposed in the row of a memory array. For example, in some other embodiments, the bit line and source line may be disposed along a corresponding one of a number of rows of a memory array and the word line may be disposed along a corresponding one of a number of columns of the same memory array, while remaining within the scope of present disclosure.

Referring still to FIG. 3, each of the efuse cells 103 is operatively coupled to the I/O circuit 108 through a corresponding one of the BLs. In various embodiments, the I/O circuit 108 includes at least a program circuit and a read circuit that can respectively program and read each of the efuse cells 103 through the respective BL. FIG. 3 illustrates an example circuit diagram of a portion of the memory device 100 (FIG. 1), in accordance with various embodiments. In the illustrated example of FIG. 3, four efuse cells, 103A, 103B, 103C, and 103D, of the memory array 102 are shown. Each of the cells 103A-D is substantially similar to the efuse cell 103 discussed with respect to FIG. 2. Although four efuse cells are shown, it should be appreciated that the memory array 102 can have any number of efuse cells, while remaining within the scope of present disclosure.

Referring still to FIG. 3, each of the efuse cells 103 is operatively coupled to the I/O circuit 108 through a corresponding one of the BLs. In various embodiments, the I/O circuit 108 includes at least a program circuit and a read circuit that can respectively program and read each of the efuse cells 103 through the respective BL. The efuse cells 103 are each fabricated as a short circuit and programmed to be an open circuit, in accordance with various embodiments.

Figure 4:
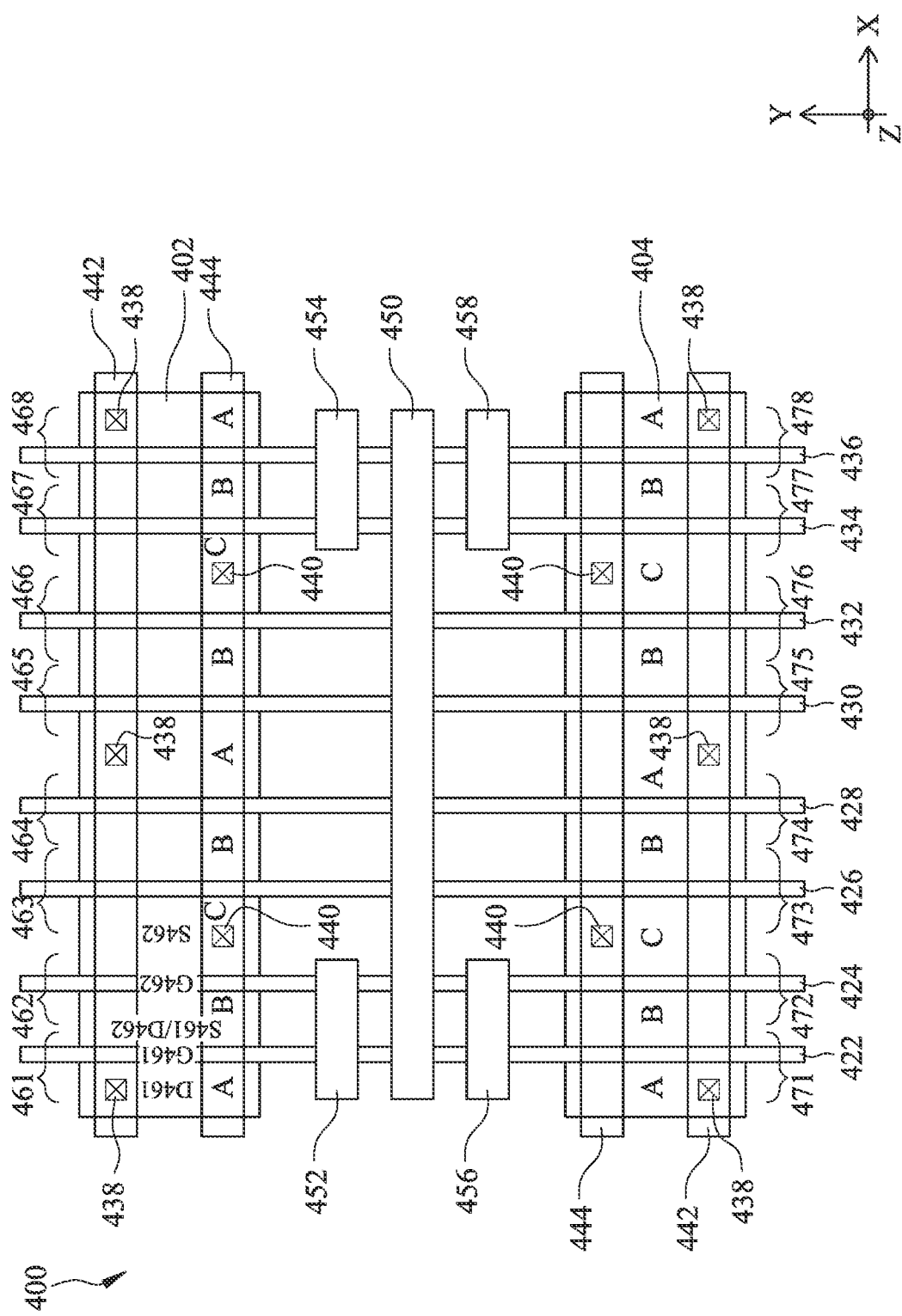
FIG. 4 illustrates an example layout to fabricate one memory cell of the memory device of FIG. 1, in accordance with some embodiments.

FIG. 4 illustrates an example layout 400 of one of the disclosed efuse cells (e.g., 103), in accordance with various embodiments. The efuse cell, as disclosed herein, is formed of a first transistor, a second transistor and a fuse resistor that are operatively (e.g., electrically) coupled in series. The first transistor and second transistor are formed in the same active region. Alternatively stated, respective conduction channels of the first and second transistors extend along the lengthwise direction of a common active region, and respective source/drain structures of the first and second transistors are formed based on the common active region, which will be discussed as follows. Further, the first and second transistors can be constructed by a number (e.g., 100) of sub-transistors, each of which is electrically coupled to one another in parallel; and the fuse resistor can be constructed by a metal structure disposed above those sub-transistors.

As shown, the layout 400 includes patterns 402 and 404 that are each configured to form an active region (hereinafter "active region 402" and "active region 404," respectively); and patterns 422, 424, 426, 428, 430, 432, 434, and 436 that are each configured to form a gate structure (hereinafter "gate structure 422," "gate structure 424," "gate structure 426," "gate structure 428," "gate structure 430," "gate structure 432," "gate structure 434," "gate structure 436," respectively). The active regions 402 and 404 may extend along a first lateral direction (e.g., X direction), while the gate structures 422 to 436 may extend along a second, different lateral direction (e.g., Y direction). It should be understood that the layout 400 can include any number of each of the active regions, and gate structures, while remaining within the scope of present disclosure.

In some embodiments, each of the active regions 402 and 404 is formed of a one-piece fin structure protruding from a major surface of a substrate. In some other embodiments, each of the active regions 402 and 404 is formed of a stack structure protruding from a major surface of a substrate. The stack includes a number of semiconductor nanostructures (e.g., nanosheets) extending along the X direction and vertically separated from each other. Portions of the fin structure or portions of the semiconductor nanostructures in the stack that are overlaid by the gate structure remain, while other portions are replaced with a number of epitaxial structures.

The remaining portions of the fin structure or semiconductor nanostructures can be configured as the channel of a corresponding transistor (or sub-transistor), the epitaxial structures coupled to both sides (or ends) of the remaining portions of the semiconductor structures can be configured as source/drain structures (or terminals) of the transistor (or sub-transistor), and a portion of the gate structure that overlays (e.g., straddles) the remaining portions of the semiconductor structures can be configured as a gate structures (or terminal) of the transistor (or sub-transistor). In the implementation where the active regions 402 and 404 are each formed as a one-piece fin structure, the corresponding transistors (or sub-transistors) are each formed as a fin field-effect-transistor (FinFET). In the implementation where the active regions 402 and 404 are each formed as a stack of nanostructures, the corresponding transistors (or sub-transistors) are each formed as a gate-all-around field-effect-transistor (GAAFET).

For example in FIG. 4, the portion of the active region 402 that is overlaid by the gate structure 422 can function as the channel of a first sub-transistor 461. The portions of the active region 402 that are disposed on opposite sides of the gate structure 422 are replaced with epitaxial structures. These epitaxial structures can function as a drain structure/region/terminal (indicated with "$D_{461}$" in FIG. 4) and a source structure/region/terminal (indicated with "$S_{461}$" in FIG. 4) of the sub-transistor 461, respectively. The gate structure 422 can function as a gate terminal (indicated with "$G_{461}$" in FIG. 4) of the sub-transistor 461. Similarly, the portion of the active region 402 that is overlaid by the gate structure 424 can function as the channel of a second sub-transistor 462. The portions of the active region 402 that are disposed on opposite sides of the gate structure 424 are replaced with epitaxial structures that can function as a drain structure/region/terminal (indicated with "$D_{462}$" in FIG. 4) and a source structure/region/terminal (indicated with "$S_{462}$" in FIG. 4) of the sub-transistor 462, respectively. The gate structure 424 can function as a gate terminal (indicated with "$G_{462}$" in FIG. 4) of the sub-transistor 462. The source structure $S_{461}$ of sub-transistor 461 and the drain structure $D_{462}$ of sub-transistor 462 merge, in some embodiments.

Based on this principle, it should be appreciated that the active region 402 and the gate structures 422 to 436 of the layout 400 can collectively form a certain number of such sub-transistors, e.g., 461, 462, 463, 464, 465, 466, 467, and 468, each of which includes a pair of source/drain terminals disposed on opposite sides of its gate terminal. Further, neighboring sub-transistors within the same active region can have one of their respective source or drain structures merge. Similarly, the active region 404 and the gate structures 422 to 436 of the layout 400 can collectively form a certain number of sub-transistors, e.g., 471, 472, 473, 474, 475, 476, 477, and 478, each of which includes a pair of source/drain terminals disposed on opposite sides of its gate terminal.

In some embodiments, a first group of such sub-transistors can be electrically coupled to each other in parallel to collectively function as a first transistor, and a second group of such sub-transistors can be electrically coupled to each other in parallel to collectively function as a second transistor. And, the first group of sub-transistors (i.e., the first transistor) and the second group of sub-transistors (i.e., the second transistor) are coupled to each other in series to form those two serially coupled transistors (e.g., 204 and 206) of the disclosed efuse cell. For example, the sub-transistor 461 and a number of other sub-transistors of the first group that are coupled to one another in parallel can form the first transistor of the disclosed efuse cell, and the sub-transistor 462 and a number of other sub-transistors of the second group that are coupled to one another in parallel can form the second transistor of the disclosed efuse cell, which will be discussed as follows.

Figure 5:
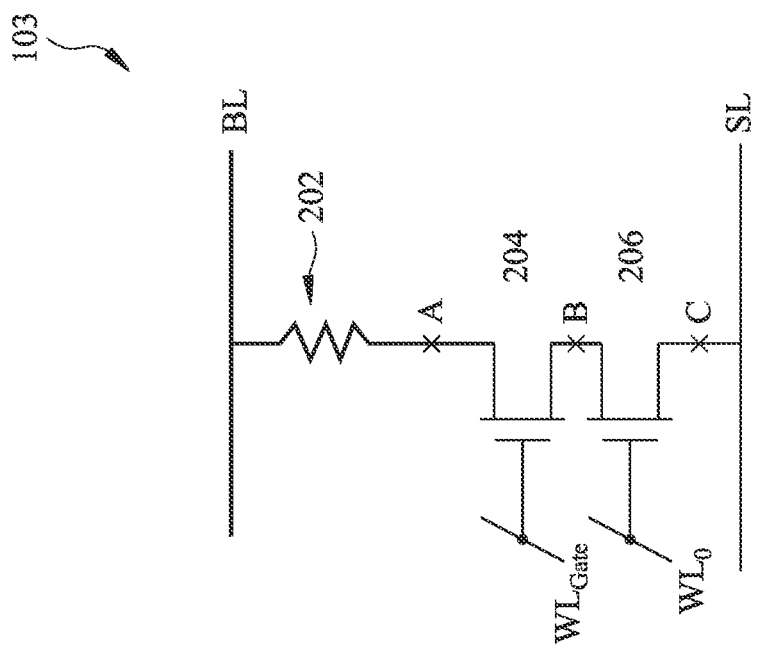
FIG. 5 illustrates an example circuit diagram of the memory cell of the memory device of FIG. 1, in accordance with some embodiments.

To illustrate how the layout 400 is used to form the first transistor and second transistor of a disclosed efuse cell, a circuit diagram of the disclosed efuse cell (e.g., 103) is again shown in FIG. 5, in accordance with various embodiments. When the first transistor 204 and second transistor 206 of the efuse cell 103 are each implemented as an n-type transistor, as shown in FIG. 5, the first transistor 204 and second transistor 206 are connected to each other at a common node "B," with a drain terminal of the first transistor 204 coupled to one end of the fuse resistor 202 at a node "A" and with a source terminal of the second transistor 206 coupled to a SL at a node "C." Each of the first transistor 204 and second transistor 206 can include a number of sub-transistors, either in a common active region or in respectively different active regions, electrically coupled to one another in parallel. It should be appreciated that the sub-transistors within one common active region (e.g., 402 of FIG. 4) can already form the first transistor 204 and second transistor 206 of the disclosed efuse cell 103. Optionally, the first transistor 204 and second transistor 206 may be further formed by other sub-transistors within another common active region (e.g., 404 of FIG. 4).

For example in FIG. 4, within the active region 402, the sub-transistors 461, 464, 465, and 468, with their respective source and drain terminals labeled with nodes A and B, can collectively form the first transistor 204, and the sub-transistors 462, 463, 466, and 467, with their respective source and drain terminals labeled with nodes B and C, can collectively form the second transistor 206. Similarly, within the active region 404, the sub-transistors 471, 474, 475, and 478, with their respective source and drain terminals labeled with nodes A and B, can collectively form the first transistor 204, and the sub-transistors 472, 473, 476, and 477, with their respective source and drain terminals labeled with nodes B and C, can collectively form the second transistor 206. Stated another way, the sub-transistors 461, 464, 465, 468, 471, 474, 475, and 478 can form the above-mentioned first group configured to form the first transistor 204, and the sub-transistors 462, 463, 466, 467, 472, 473, 476, and 477 can form the above-mentioned second group configured to form the second transistor 206. Such first and second groups of sub-transistors can be electrically coupled to one another with a number of interconnect structures to functionally form the first transistor 204 and second transistor 206, respectively, which will be discussed as follows.

For example in FIG. 4, the layout 400 includes patterns 438 and 440 that are each configured to form a via interconnect structure (hereinafter "via structure 438" and "via structure 440," respectively), and patterns 442 and 444 that are each configured to form a line interconnect structure (hereinafter "line structure 442" and "line structure 444," respectively). The via structures 438 and 440 can extend along a vertical direction (e.g., the Z direction) to couple a corresponding drain or source terminal to a corresponding interconnect structure, e.g., the line structure 442 or 444. In various embodiments, the nodes A (i.e., the respective drain terminals of the sub-transistors forming the first transistor 204) are shorted together through the via structures 438 and line structures 442; and the nodes C (i.e., the respective source terminals of the sub-transistors forming the second transistor 206) are shorted together through the via structures 440 and line structures 444.

Referring still to FIG. 4, the layout 400 further includes patterns 450, 452, 454, 456, and 458 that are each configured to form a metal interconnect structure (hereinafter "metal structure 450," "metal structure 452," "metal structure 454," "metal structure 456," and "metal structure 458," respectively). The metal structures 450 to 458 may extend along the first lateral direction (e.g., the X direction), with the metal structure 450 being the longest to have a length about the same as a length of the active regions (along the X direction) and with the rest of metal structures 452 to 458 being shorter and offset from the metal structure 450 along the Y direction. In various embodiments, the metal structure 450 can function as the fuse resistor of the efuse cell (e.g., 202 of FIG. 5). Thus, based on the circuit diagram of FIG. 5, one end of the metal structure 450 (e.g., the end adjacent the metal structures 452 and 456) can be coupled to a BL, and the other end of the metal structure 450 (e.g., the end adjacent the metal structures 454 and 458) can be coupled to one or more line structures (e.g., 442) shorting the nodes A of the sub-transistors.

These interconnect structures (e.g., 442, 444, 450, 452, 454, 456, and 458) are typically formed across one or more metallization layers (e.g., part of the BEOL processing) above the sub-transistors of the first and second groups (e.g., part of the FEOL processing). For example, the line structures 442 and 444 can be formed in a bottommost metallization layer (sometimes referred to as "M0"); a number of other interconnect structures extending orthogonally to the line structures 442 and 444 (not shown) can be formed in a next upper metallization layer (sometimes referred to as "M1"); the interconnect structures 450 to 458 can be formed in a further next upper metallization layer (sometimes referred to as "M2"); and so on.

In some embodiments, these M2 metal structures, except for the metal structure 450 functioning as the fuse resistor 202, may be floating (i.e., not forming a conduction path). For example, a BL formed in one of the metallization layers and extending orthogonally to the M2 metal structures may be coupled to the M2 metal structures including the metal structures 450, 452, and 456 through via structures, respectively, but, except for the metal structure 450, none of the M2 metal structure 452 or 456 may be coupled to any transistor structures/terminals formed below (e.g., source terminals, drain terminals). With such "additional" via structures coupled to the floating metal structures, resistance values present on portions of a conduction (e.g., programming) path, other than on the metal structure 450, can be advantageously reduced. As such, the majority amount of a (e.g., voltage) signal applied on the programming path to burn down the metal structure 450 can be present (e.g., confined) between the ends of the metal structure 450, which can significantly increase programming yield of the efuse cell.

Figure 6:
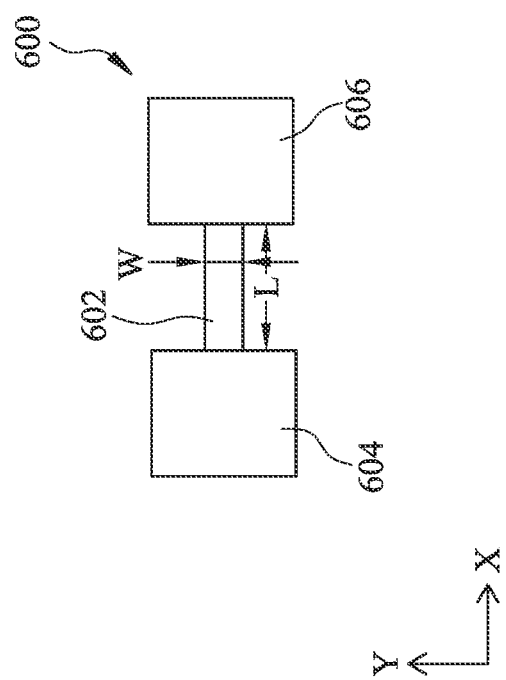
FIG. 6 illustrates a block diagram of a fuse resistor of the memory cell of the memory device of FIG. 1, in accordance with some embodiments.

FIG. 6 illustrates a block diagram 600 representing the metal structures associated with the fuse resistor 202 (e.g., 450 to 458 of FIG. 4) discussed above, in accordance with some embodiments. As shown, the block diagram 600 includes portions 602, 604, and 606. The portion 602 represents a majority (e.g., central) portion of the metal structure 450 that are not overlapped with any of the floating metal structures 452 to 4588; the portion 604 represents a collection of two (e.g., side) portions of the metal structure 450 overlapping with the metal structures 456 and 456, and the metal structures 452 and 456 themselves; and the portion 606 represents a collection of other two (e.g., side) portions of the metal structure 450 overlapping with the metal structures 454 and 458, and the metal structures 454 and 458 themselves. In some embodiments, the portion 602 may be characterized with dimensions width (W) and length (L), as shown, which may also represent the width and length of the metal structure 450 (i.e., the fuse resistor 202). By changing W and/or L, various characteristics of the efuse cell such as, for example, a programming voltage of the efuse cell, may vary. Both W and L may equal to or greater than a minimum width and a minimum length required by a certain technology node being implemented to fabricate the transistors 204 and 206, respectively.

Figure 7:
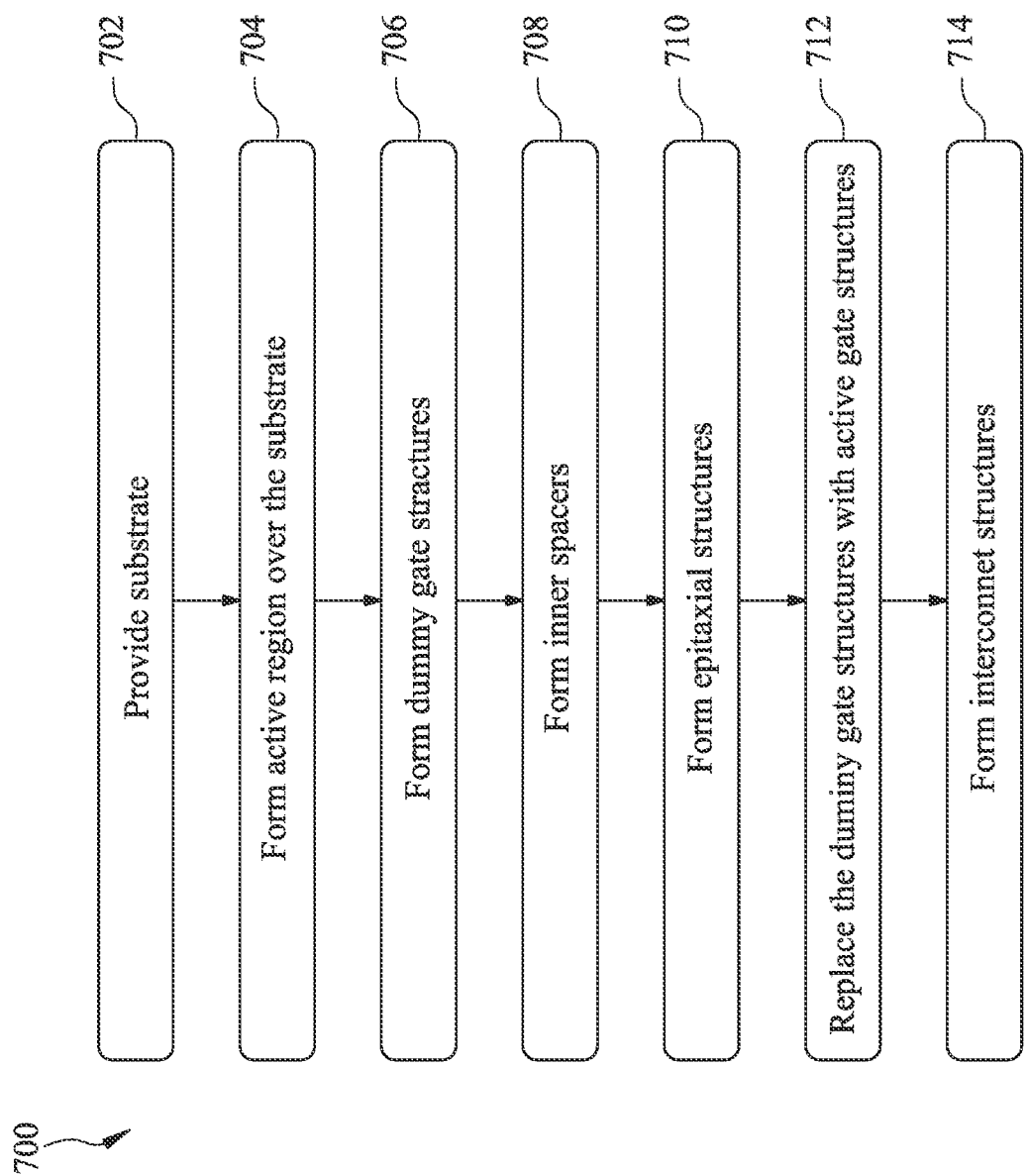
FIG. 7 illustrates a flow chart of a method for fabricating at least one memory cell of the memory device of FIG. 1, in accordance with some embodiments.

FIG. 7 illustrates a flowchart of a method 700 to form at least a portion of the disclosed memory device 100 (e.g., memory cell 103), according to one or more embodiments of the present disclosure. For example, the method 700 includes operations to fabricate a number of sub-transistors forming the first transistor and second transistor, respectively, of the efuse cell 103. It is noted that the method 700 is merely an example and is not intended to limit the present disclosure. Accordingly, it is understood that additional operations may be provided before, during, and after the method 700 of FIG. 7, and that some other operations may only be briefly described herein.

The method 700 starts with operation 702 in which a substrate is provided, in accordance with various embodiments. The substrate includes a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

The method 700 proceeds to operation 704 in which one or more active regions are formed, in accordance with various embodiments. Such an active region can be defined based on one of the (active region) patterns 402 and 404 of FIG. 4. The (active region) patterns 402 and 404 can each define a planar region/well, a fin structure, or a stack of nanostructure over the substrate.

For example, in some embodiments, the active regions 402 and 404 of FIG. 4 may each be a one-piece fin structure to form the first transistor and second transistor of the efuse cell 103 as fin field-effect transistors (FinFETs). In some other embodiments, the active regions 402 and 404 of FIG. 4 may each be a stack including an alternating series of first nanostructures and second nanostructures to form the first transistor and second transistor of the efuse cell 103 as gate-all-around field-effect transistors (GAA FETs). As noted above, one active region can form the sub-transistors of the first transistor and second transistor, respectively, of the efuse cell 103.

In the embodiments where the active region is a stack, the first nanostructures may include SiGe sacrificial nanostructures, and the second nanostructures may include Si channel nanostructures. Such a stack may sometimes be referred to as a super-lattice. In a non-limiting example, the SiGe sacrificial nanostructures can be SiGe 25%. The notation "SiGe 25%" is used to indicate that 25% of the SiGe material is Ge. It is understood the percentage of Ge in each of the SiGe sacrificial nanostructures can be any value between 0 and 100 (excluding 0 and 100), while remaining within the scope of present disclosure. In some other embodiments, the second nanostructures may include a first semiconductor material other than Si and the first nanostructures may include a second semiconductor material other than SiGe, as long as the first and second semiconductor materials are respectively characterized with different etching properties (e.g., etching rates).

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The method 700 proceeds to operation 706 in which a number of dummy gate structures are formed, in accordance with various embodiments. Such a dummy gate structure can each be formed based on one of the (gate structure) patterns 422 to 436 of FIG. 4. The dummy gate structure can be formed by depositing amorphous silicon (a-Si) over the one-piece fin structure or the stack. Other materials suitable for forming dummy gates (e.g., polysilicon) can be used while remaining within the scope of present disclosure. The a-Si is then planarized to a desired level. A hard mask is deposited over the planarized a-Si and patterned. The hard mask can be formed from a nitride or an oxide layer. An etching process (e.g., a reactive-ion etching (RIE) process) is applied to the a-Si to form the dummy gate structure. After forming the dummy gate structure, gate spacers may be formed to extend along sidewalls of the dummy gate structure. The gate spacers can be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

In the embodiments where the active regions are each formed as a stack of nanostructures (to form GAAFETs), the method 700 optionally proceeds to operation 708 in which inner spacers are formed by replacing end portions of each of the SiGe sacrificial nanostructures with a dielectric material, in accordance with various embodiments. Upon forming the dummy gate structure overlaying the one-piece fin structure or certain portions of the stack (e.g., the portions of the stack separated by the dielectric fin structure), the non-overlaid portions of the stack are removed. Next, respective end portions of each SiGe sacrificial nanostructure of the overlaid fin structure or stack are removed. The inner spacers are formed by filling such recesses of each SiGe sacrificial nanostructure with a dielectric material by chemical vapor deposition (CVD), or by monolayer doping (MLD) of nitride followed by spacer RIE. A material of the inner spacers can be formed from the same or different material as the gate spacers described above. For example, the inner spacers can be formed of silicon nitride, silicoboron carbonitride, silicon carbonitride, silicon carbon oxynitride, or any other type of dielectric material (e.g., a dielectric material having a dielectric constant k of less than about 5).

The method 700 proceeds to operation 710 in which a number of epitaxial structures, e.g. $D_{461}$, $S_{461}$, $D_{462}$, $S_{462}$ of FIG. 4, are formed, in accordance with various embodiments. Upon forming dummy gate structures (and optionally the inner spacers for the embodiments of stack active regions), the epitaxial structures are formed using an epitaxial layer growth process on exposed ends of the Si fin structure or Si nanostructures. In-situ doping (ISD) may be applied to form doped epitaxial structures, thereby creating the necessary junctions for a corresponding transistor (or sub-transistor). N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). After forming the epitaxial structures, an inter-layer dielectric (e.g., silicon dioxide) is deposited to overlay the epitaxial structures.

The method 700 proceeds to operation 712 in which at least the dummy gate structures are replaced with respective active gate structures, e.g. 422, 424 of FIG. 4, in accordance with various embodiments. In the embodiments where the active regions are each formed as a one-piece fin structure, only the dummy gate structures are replaced with active gate structures. As such, the active gate structures can straddle a number of portions of the fin structure. In the embodiments wherein the active gate structures, in accordance with various embodiments. In the embodiments where the active regions are each formed as a stack of Si and SiGe nanostructures, the dummy gate structures together with the remaining SiGe sacrificial nanostructures are replaced by the active gate structures. As such, the active gate structures can each wrap around each of the Si channel nanostructures.

For example, subsequently to forming the inter-layer dielectric at operation 710, the dummy gate structures are removed by an etching process, e.g., RIE or chemical oxide removal (COR). Next, the remaining SiGe sacrificial nanostructures are removed while keeping the Si channel nanostructure substantially intact by applying a selective etch (e.g., a hydrochloric acid (HCl)). After the removal of the SiGe sacrificial nanostructures, top and bottom surfaces and sidewalls of each of the Si channel nanostructures can be exposed. Next, a number of active gate structures can be formed to wrap around each of the Si channel nanostructures. Each of the active gate structures includes at least a gate dielectric layer (e.g., a high-k dielectric layer) and a gate metal layer (e.g., a work function metal layer). Accordingly, such an active gate structure is sometimes referred to as a metal gate structure. Upon the active gate structures are formed, a number of sub-transistors of the disclosed efuse cell can be formed.

The method 700 proceeds to operation 714 in which a number of interconnect structures are formed, in accordance with various embodiments. Upon forming the sub-transistors, a number of interconnect structures, one of which can be configured as a fuse resistor of the efuse cell, are formed over the sub-transistors. In some embodiments where a plurality of transistors, including first and second transistors of the disclosed efuse cell (e.g., 204 and 206) are formed, at least a first interconnect structure (e.g., defined by the pattern 442) electrically coupled to the drain structure of the first transistor 204 may be formed. Further, at least a second interconnect structure (e.g., defined by the pattern 444) electrically coupled to the source structure of the second transistor may be formed.

It should be understood that the fuse resistor and other interconnect structures can be formed in any of the metallization layers, while remaining within the scope of present disclosure. The interconnect structure (and the fuse resistor) are each formed of a metal material. The metal material can be at least one of: aluminum, tungsten, tungsten nitride, copper, cobalt, silver, gold, chrome, ruthenium, platinum, titanium, titanium nitride, tantalum, tantalum nitride, or nickel, hafnium. Other metal materials are within the scope of the present disclosure. The interconnect structures (and the furs resistor) can be formed by overlaying the workpiece with the above-listed metal material by, for example, chemical vapor deposition (CVD), physical vapor deposition (PVD), electroless plating, electroplating, or combinations thereof.

FIGS. 8A, 8B, 8C, 8D, 8E, and 8F illustrate various block diagrams of different portions of the disclosed efuse cell (e.g., 103), in accordance with some embodiments. Specifically, FIGS. 8A-F show relative arrangement of one or more transistor portions and a resistor portion. In some embodiments, each transistor portion may include a number of active regions (N) extending in the X direction and a number of gate structures (M) extending in the Y direction. Using the layout 400 of FIG. 4 as an example, there are two transistor portions respectively formed by the active region 402 and active region 404, and thus, "N" of these transistor portions is equal to 1. Each of these transistor portions has 8 gate structures, and thus, "M" of theses transistor portions is equal to 8. In the following description, the transistor portion in which N is greater than or equal to M will be referred to as MOSA and the transistor portion in which M is higher than N will be referred to as MOSB. The resistor portion includes at least one metal structure configured as a fuse resistor and a number of floating metal structures disposed next to ends of the fuse resistor, as shown in the block diagram 600 of FIG. 6.

Figure 8C:
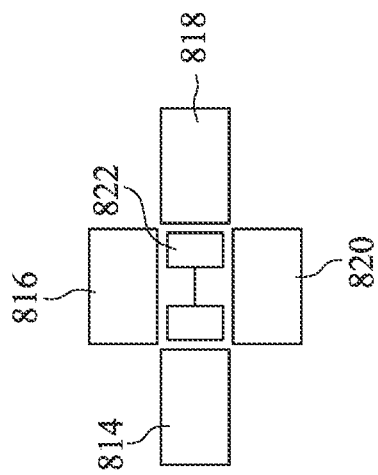
FIGS. 8A, 8B, 8C, 8D, 8E, and 8F illustrate various block diagrams of different portions of one memory cell of the memory device of FIG. 1, in accordance with some embodiment.
Figure 8B:
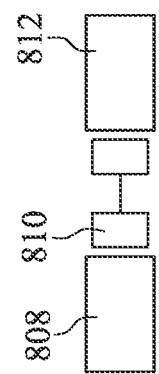
Figure 8A:
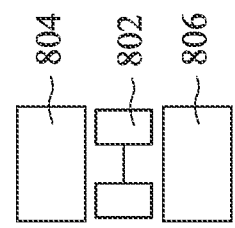
Figure 8F:
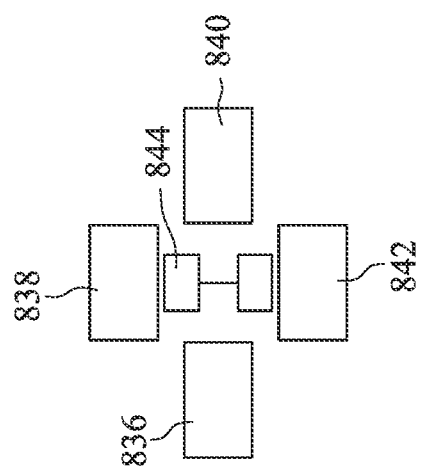
Figure 8E:
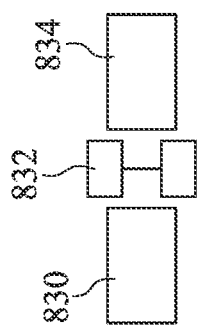
Figure 8D:
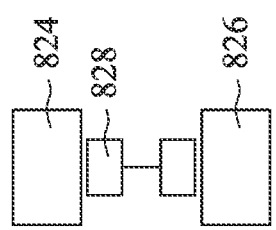

In FIG. 8A, transistor portions 804 and 806 are positioned on opposite sides of a resistor portion 802 along the Y direction. Further, the resistor portion 802 extends in the X direction, and the transistor portions 804 and 806 are arranged such they are aligned with the resistor 802 in the Y direction. The transistor portions 804 and 806 can be any of the following combinations: MOSA and MOSA; MOSB and MOSB; MOSA and MOSB; or MOSB and MOSA. In FIG. 8B, transistor portions 808 and 812 are positioned on opposite sides of a resistor portion 810 along the Y direction. Further, the resistor portion 810 extends in the X direction, and the transistor portions 808 and 812 are arranged such they are aligned with the resistor portion 810 in the X direction. The transistor portions 808 and 812 can be any of the following combinations: MOSA and MOSA; MOSB and MOSB; MOSA and MOSB; or MOSB and MOSA. In FIG. 8C, a resistor portion 822 may be surrounded by four transistor portions 814, 816, 818, and 820, with the resistor portion 822 extending along the X direction. For example, the transistor portions 814 and 818 are aligned at opposite ends of the resistor portion 822 in the X direction, while transistor portions 816 and 820 are aligned at opposite ends of the resistor portion 822 in the Y direction. The transistor portions 814 and 818 can be any of the following combinations: MOSA and MOSA; MOSB and MOSB; MOSA and MOSB; or MOSB and MOSA; and the transistor portions 816 and 820 can be any of the following combinations: MOSA and MOSA; MOSB and MOSB; MOSA and MOSB; or MOSB and MOSA. In FIG. 8D, a resistor portion 828 may extend in the Y direction, with transistor portions 824 and 826 arranged such they are generally aligned with the resistor portion 828 in the Y direction. The transistor portions 824 and 826 can be any of the following combinations: MOSA and MOSA; MOSB and MOSB; MOSA and MOSB; or MOSB and MOSA. In FIG. 8E, a resistor portion 832 may extend in the Y direction, with transistor portions 830 and 834 arranged such they are generally aligned with the resistor portion 832 in the X direction. The transistor portions 830 and 834 can be any of the following combinations: MOSA and MOSA; MOSB and MOSB; MOSA and MOSB; or MOSB and MOSA. In FIG. 8F, a resistor portion 844 may be surrounded by four transistor portions 836, 838, 840, and 842, with the resistor portion 844 extending along the Y direction. For example, the transistor portions 836 and 840 are aligned at opposite ends of the resistor portion 844 in the X direction, while transistor portions 838 and 842 are aligned at opposite ends of the resistor portion 844 in the Y direction. The transistor portions 836 and 840 can be any of the following combinations: MOSA and MOSA; MOSB and MOSB; MOSA and MOSB; or MOSB and MOSA; and the transistor portions 838 and 842 can be any of the following combinations: MOSA and MOSA; MOSB and MOSB; MOSA and MOSB; or MOSB and MOSA.

FIGS. 9A, 9B, 9C and 9D illustrate various block diagrams of different portions of the disclosed efuse cell (e.g., 103), in accordance with some embodiments. Specifically, FIGS. 9A-D show relative arrangement of one or more transistor portions and a resistor portion, as defined above.

In FIG. 9A, transistor portions 902 and 904 are positioned on one side of a resistor portion 906 along the Y direction. Further, the resistor portion 906 extends in the X direction, and the transistor portions 902 and 904 are arranged such they are aligned on one side of the resistor 906 in the Y direction. The transistor portions 902 and 904 can be any of the following combinations: MOSA and MOSA; MOSB and MOSB; MOSA and MOSB; or MOSB and MOSA. In FIG. 9B, transistor portions 910 and 912 are positioned on one side of a resistor portion 908 along the Y direction. Further, the resistor portion 908 extends in the X direction, and the transistor portions 910 and 912 are arranged such they are aligned on one side of the resistor 910 in the Y direction. The transistor portions 910 and 912 can be any of the following combinations: MOSA and MOSA; MOSB and MOSB; MOSA and MOSB; or MOSB and MOSA. In FIG. 9C, transistor portions 918 and 920 are positioned on one side of a resistor portion 916 along the Y direction, and transistor portion 914 is positioned on the other side of the resistor portion 916 along the Y direction. Further, the resistor portion 916 extends in the X direction, and the transistor portions 914, 918, and 920 are arranged such they are aligned on both sides of the resistor 916 in the Y direction. The transistor portions 914, 918, and 920 can be any of the following combinations: MOSA, MOSA, and MOSA; MOSB, MOSB and MOSB; MOSA, MOSB, and MOSB; or MOSB, MOSA, and MOSA. In FIG. 9D, transistor portions 922 and 924 are positioned on one side of a resistor portion 926 along the Y direction, and transistor portion 928 is positioned on the other side of the resistor portion 926 along the Y direction. Further, the resistor portion 926 extends in the X direction, and the transistor portions 922, 924, and 928 are arranged such they are aligned on both sides of the resistor 926 in the Y direction. The transistor portions 922, 924, and 928 can be any of the following combinations: MOSA, MOSA, and MOSA; MOSB, MOSB and MOSB; MOSA, MOSB, and MOSB; or MOSB, MOSA, and MOSA.

Figure 10B:
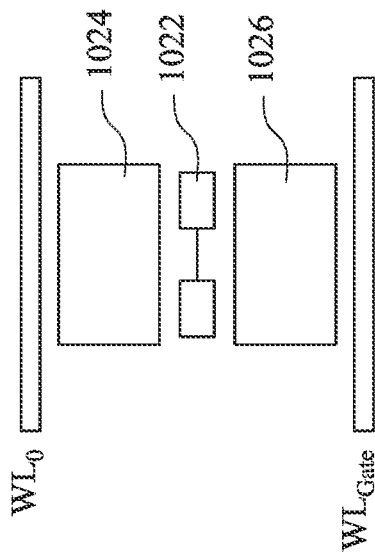
FIGS. 10A and 10B illustrate various block diagrams of different portions of one memory cell of the memory device of FIG. 1, in accordance with some embodiments.
Figure 10A:
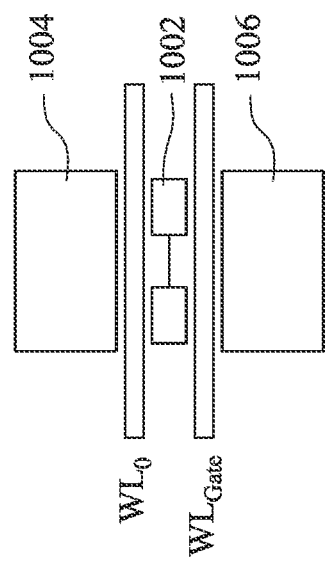

FIGS. 10A and 10B illustrate various block diagrams of different portions of the disclosed efuse cell (e.g., 103), in accordance with some embodiments. Specifically, FIGS. 10A-B show relative positions of one or more transistor portions, a resistor portion, and a pair of WLs coupled to the first and second transistors, respectively (e.g., $WL_0$ and $WL_{Gate}$ shown in FIGS. 2 and 5). In FIG. 10A, $WL_0$ is positioned between a resistor portion 1002 and one of two transistor portions, 1004, along the Y direction; and $WL_{Gate}$ is positioned between the resistor portion 1002 and the other of the two transistor portions, 1006, along the Y direction. The transistor portions 1004 and 1006 can be any of the following combinations: MOSA and MOSA; MOSB and MOSB; MOSA and MOSB; or MOSB and MOSA. In FIG. 10B, one of two transistor portions, 1024, is positioned between a resistor portion 1022 and $WL_0$ along the Y direction; and the other of the two transistor portions, 1026, is positioned between the resistor portion 1022 and $WL_{Gate}$ along the Y direction. The transistor portions 1024 and 1026 can be any of the following combinations: MOSA and MOSA; MOSB and MOSB; MOSA and MOSB; or MOSB and MOSA.

Figures 11A, 11B:
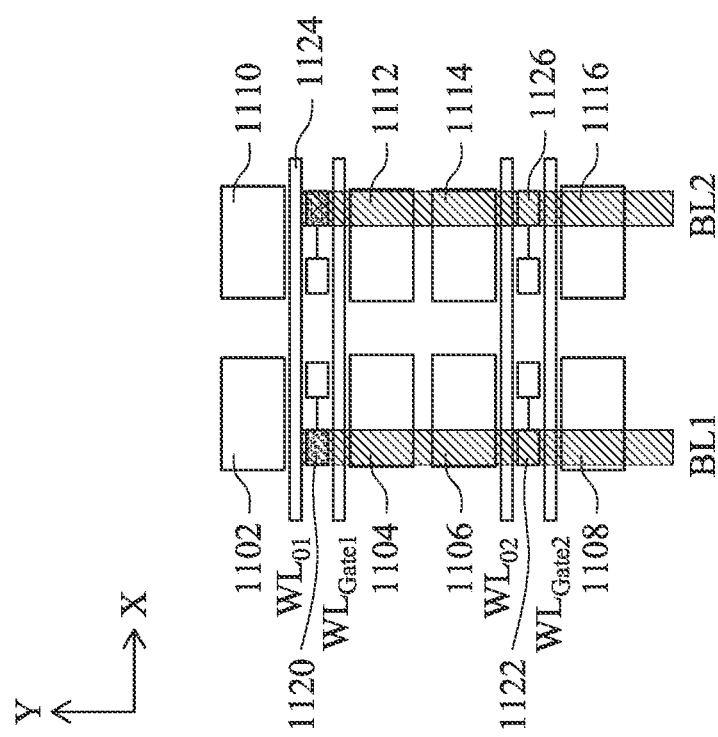
FIGS. 11A and 11B illustrate various block diagrams of a number of memory cells of the memory device of FIG. 1, each of which includes a number of different portions, in accordance with some embodiment.

FIGS. 11A and 11B illustrate various block diagrams of different portions of a number of the disclosed efuse cells (e.g., 103) formed as an array, in accordance with some embodiments. Specifically, FIGS. 11A-B show relative positions of one or more transistor portions, a resistor portion, and a pair of WLs coupled to each of four efuse cells, and respective BLs coupled to those four efuse cells.

In FIG. 11A, $WL_{O1}$ is positioned between a resistor portion 1120 and a transistor portion 1102 along the Y direction; $WL_{Gate1}$ is positioned between the resistor portion 1120 and a transistor portion 1104 along the Y direction; the $WL_{O1}$ is further positioned between a resistor portion 1124 and a transistor portion 1110 along the Y direction; and the $WL_{Gate1}$ is further positioned between the resistor portion 1124 and a transistor portion 1112 along the Y direction. Similarly, $WL_{O2}$ is positioned between a resistor portion 1122 and a transistor portion 1106 along the Y direction; $WL_{Gate2}$ is positioned between the resistor portion 1122 and a transistor portion 1108 along the Y direction; the $WL_{O2}$ is further positioned between a resistor portion 1126 and a transistor portion 1114 along the Y direction; and the $WL_{Gate2}$ is further positioned between the resistor portion 1126 and a transistor portion 1116 along the Y direction. The transistor portions 1102 and 1104 can be any of the following combinations: MOSA and MOSA; MOSB and MOSB; MOSA and MOSB; or MOSB and MOSA. The transistor portions 1106 and 1108 can be any of the following combinations: MOSA and MOSA; MOSB and MOSB; MOSA and MOSB; or MOSB and MOSA. The transistor portions 1110 and 1112 can be any of the following combinations: MOSA and MOSA; MOSB and MOSB; MOSA and MOSB; or MOSB and MOSA. The transistor portions 1114 and 1116 can be any of the following combinations: MOSA and MOSA; MOSB and MOSB; MOSA and MOSB; or MOSB and MOSA.

In some embodiments, the transistor portions 1102 and 1104, together with the resistor portion 1120, can form a first one the four efuse cells; the transistor portions 1110 and 1112, together with the resistor portion 1124, can form a second one the four efuse cells; the transistor portions 1106 and 1108, together with the resistor portion 1122, can form a third one the four efuse cells; and the transistor portions 1114 and 1116, together with the resistor portion 1126, can form a fourth one the four efuse cells. The $WL_{O1}$ and $WL_{Gate1}$ can be coupled to the first and second efuse cells; and the $WL_{O2}$ and $WL_{Gate2}$ can be coupled to the third and fourth efuse cells. Further, $BL_1$ can be coupled to the resistor portion 1120 of the first efuse cell and to the resistor portion 1122 of the third efuse cell; and $BL_2$ can be coupled to the resistor portion 1124 of the second efuse cell and to the resistor portion 1126 of the fourth efuse cell.

In FIG. 11B, a transistor portion 1142 is positioned between a resistor portion 1130 and WL01 along the Y direction; a transistor portion 1104 is positioned between the resistor portion 1130 and WLGate1 along the Y direction; the WL01 further extends along the X direction such that a transistor portion 1150 is positioned between a resistor portion 1134 and the WL01 along the Y direction; and the WLGate1 further extends along the X direction such that a transistor portion 1152 is positioned between the resistor portion 1134 and the WLGate1 along the Y direction. Similarly, a transistor portion 1146 is positioned between a resistor portion 1132 and WL02 along the Y direction; a transistor portion 1148 is positioned between the resistor portion 1132 and WLGate2 along the Y direction; the WL02 further extends along the X direction such that a transistor portion 1154 is positioned between a resistor portion 1136 and the WL02 along the Y direction; and the WLGate2 further extends along the X direction such that a transistor portion 1156 is positioned between the resistor portion 1136 and the WLGate2 along the Y direction. The transistor portions 1142 and 1144 can be any of the following combinations: MOSA and MOSA; MOSB and MOSB; MOSA and MOSB; or MOSB and MOSA. The transistor portions 1150 and 1152 can be any of the following combinations: MOSA and MOSA; MOSB and MOSB; MOSA and MOSB; or MOSB and MOSA. The transistor portions 1146 and 1148 can be any of the following combinations: MOSA and MOSA; MOSB and MOSB; MOSA and MOSB; or MOSB and MOSA. The transistor portions 1154 and 1156 can be any of the following combinations: MOSA and MOSA; MOSB and MOSB; MOSA and MOSB; or MOSB and MOSA.

In some embodiments, the transistor portions 1142 and 1144, together with the resistor portion 1130, can form a first one the four efuse cells; the transistor portions 1150 and 1152, together with the resistor portion 1134, can form a second one the four efuse cells; the transistor portions 1146 and 1148, together with the resistor portion 1132, can form a third one the four efuse cells; and the transistor portions 1154 and 1156, together with the resistor portion 1136, can form a fourth one the four efuse cells. The $WL_{O1}$ and $WL_{Gate1}$ can be coupled to the first and second efuse cells; and the $WL_{O2}$ and $WL_{Gate2}$ can be coupled to the third and fourth efuse cells. Further, $BL_1$ can be coupled to the resistor portion 1130 of the first efuse cell and to the resistor portion 1132 of the third efuse cell; and $BL_2$ can be coupled to the resistor portion 1134 of the second efuse cell and to the resistor portion 1136 of the fourth efuse cell.

In one aspect of the present disclosure, a memory device is disclosed. The memory device includes a plurality of memory cells, each one of which includes a first transistor, a second transistor, and a resistor operatively coupled to each other in series. The first transistor includes a first sub-transistor having a first channel structure, a first source structure disposed on one side of the first channel structure, and a first drain structure disposed on the other side of the first channel structure. The second transistor includes a second sub-transistor having a second channel structure, a second source structure disposed on one side of the second channel structure, and a second drain structure disposed on the other side of the second channel structure. The resistor includes a metal structure disposed above the first and second transistors. The first channel structure, the first source structure, the first drain structure, the second channel structure, the second source structure, and the second drain structure are all formed in a first active region of a substrate.

In another aspect of the present disclosure, a memory device is disclosed. The memory device includes a plurality of memory cells, each one of which includes a first transistor, a second transistor, and a first metal structure operatively coupled to each other in series, the first metal structure configured to be burned down upon the first and second transistors being activated. The first transistor includes a first channel structure, a first source structure disposed on one side of the first channel structure, and a first drain structure disposed on the other side of the first channel structure. The second transistor includes a second channel structure, a second source structure disposed on one side of the second channel structure, and a second drain structure disposed on the other side of the second channel structure. The first source structure and the second drain structure merge, with the first drain structure and the second source structure disposed on opposite sides of the merged first source structure and second drain structure.

In yet another aspect of the present disclosure, a method for fabricating a memory device is disclosed. The method includes forming a first transistor and a second transistor based on a common active region of a substrate. The first transistor includes a first channel structure, a first source structure and a first drain structure disposed on opposite sides of the first channel structure, respectively. The second transistor includes a second channel structure, a second source structure and a second drain structure disposed on opposite sides of the second channel structure, respectively. The method further includes forming a first metal structure above the first and second transistors, wherein the first metal structure is electrically coupled to the first drain structure. The method further includes forming a second metal structure above the first and second transistors, wherein the second metal structure is electrically coupled to the second source structure. The method further includes forming a third metal structure above the first and second metal structures, wherein the third metal structure is electrically coupled to the first drain structure through the first metal structure.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of memory cells, each one of which includes a first transistor, a second transistor, and a resistor operatively coupled to each other in series;
wherein the first transistor includes a first sub-transistor having:
a first channel structure;
a first source structure disposed on one side of the first channel structure; and
a first drain structure disposed on the other side of the first channel structure;
wherein the second transistor includes a second sub-transistor having:
a second channel structure;
a second source structure disposed on one side of the second channel structure; and
a second drain structure disposed on the other side of the second channel structure;
wherein the resistor includes a first metal structure, a second metal structure, and a third metal structure,
wherein the first metal structure is disposed above the first and second transistors and electrically coupled to the first drain structure,
wherein the second metal structure is disposed above the first and second transistors and electrically coupled to the second source structure,
wherein the third metal structure is disposed above the first and second metal structures and electrically coupled to the first drain structure through the first metal structure,
wherein the third metal structure is configured to be burned down upon the first and second transistors being activated; and
wherein the first channel structure, the first source structure, the first drain structure, the second channel structure, the second source structure, and the second drain structure are all formed in a first active region of a substrate.

2. The memory device of claim 1, wherein the first source structure and the second drain structure merge.

3. The memory device of claim 2, wherein the merged first source structure and the second drain structure are interposed between the first drain structure and the second source structure.

4. The memory device of claim 1, wherein the plurality of memory cells each includes an electrical fuse.

5. The memory device of claim 1, wherein the first channel structure and the second channel structure each includes a fin structure.

6. The memory device of claim 1, wherein the first channel structure and the second channel structure each includes a plurality of nanostructures vertically spaced apart from one another.

7. The memory device of claim 1, wherein the first transistor further includes a third sub-transistor electrically coupled to the first sub-transistor in parallel and having:
a third channel structure;
a third source structure disposed on one side of the third channel structure; and
a third drain structure disposed on the other side of the third channel structure;
wherein the third channel structure, the third source structure, the third drain structure are also formed in the first active region.

8. The memory device of claim 7, wherein the second transistor further includes a fourth sub-transistor electrically coupled to the second sub-transistor in parallel and having:
a fourth channel structure;
a fourth source structure disposed on one side of the fourth channel structure; and
a fourth drain structure disposed on the other side of the fourth channel structure;

wherein the fourth channel structure, the fourth source structure, the fourth drain structure are also formed in the first active region.

9. The memory device of claim 8, wherein the second channel structure is interposed between the first and fourth channel structures, and the fourth channel structure is interposed between the second and third channel structures.

10. The memory device of claim 8, wherein the second source structure and the fourth source structure merge, and the third source structure and the fourth drain structure merge.

11. The memory device of claim 7, wherein the first transistor further includes a fifth sub-transistor electrically coupled to the first and third sub-transistors in parallel and having:
 a fifth channel structure;
 a fifth source structure disposed on one side of the fifth channel structure; and
 a fifth drain structure disposed on the other side of the fifth channel structure;
 wherein the fifth channel structure, the fifth source structure, the fifth drain structure are also formed in a second active region of the substrate.

12. The memory device of claim 11, wherein the second active region is spaced apart from the first active region.

13. A memory device, comprising:
 a memory cell including a first transistor, a second transistor, and a resistor operatively coupled to each other in series;
 wherein the first transistor includes:
  a first channel structure;
  a first source structure disposed on one side of the first channel structure; and
  a first drain structure disposed on the other side of the first channel structure;
 wherein the second transistor includes:
  a second channel structure;
  a second source structure disposed on one side of the second channel structure; and
  a second drain structure disposed on the other side of the second channel structure;
 wherein the resistor includes:
  a first metal structure disposed above the first and second transistors, wherein the first metal structure is electrically coupled to the first drain structure;
  a second metal structure disposed above the first and second transistors, wherein the second metal structure is electrically coupled to the second source structure; and
  a third metal structure disposed above the first and second metal structures, wherein the third metal structure is electrically coupled to the first drain structure through the first metal structure, wherein the third metal structure is configured to be burned down upon the first and second transistors being activated; and
 wherein the first source structure and the second drain structure merge, with the first drain structure and the second source structure disposed on opposite sides of the merged first source structure and second drain structure.

14. The memory device of claim 13, wherein the first transistor, the second transistor, and the resistor collectively function as a one-time-programmable memory cell.

15. The memory device of claim 13, wherein the first channel structure, the first source structure, the first drain structure, the second channel structure, the second source structure, and the second drain structure are formed in a common active region of a substrate.

16. The memory device of claim 13, wherein the first channel structure and the second channel structure each includes a fin structure.

17. The memory device of claim 13, wherein the first channel structure and the second channel structure each includes a plurality of nanostructures vertically spaced apart from one another.

18. A method for fabricating a memory device, comprising:
 forming a first transistor and a second transistor based on a common active region of a substrate, wherein the first transistor includes a first channel structure, a first source structure and a first drain structure disposed on opposite sides of the first channel structure, respectively, and the second transistor includes a second channel structure, a second source structure and a second drain structure disposed on opposite sides of the second channel structure, respectively;
 forming a first metal structure above the first and second transistors, wherein the first metal structure is electrically coupled to the first drain structure;
 forming a second metal structure above the first and second transistors, wherein the second metal structure is electrically coupled to the second source structure; and
 forming a third metal structure above the first and second metal structures, wherein the third metal structure is electrically coupled to the first drain structure through the first metal structure, wherein the third metal structure is configured to be burned down upon the first and second transistors being activated.

* * * * *